(12) United States Patent
Iwase (10) Patent No.: US 8,597,765 B2
(45) Date of Patent: Dec. 3, 2013

(54) FUNCTIONAL FILM

(71) Applicant: Fujifilm Corporation, Tokyo (JP)

(72) Inventor: Eijirou Iwase, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 13/859,120

(22) Filed: Apr. 9, 2013

(65) Prior Publication Data

US 2013/0224435 A1 Aug. 29, 2013

Related U.S. Application Data

(62) Division of application No. 13/030,757, filed on Feb. 18, 2011.

(30) Foreign Application Priority Data

Feb. 19, 2010 (JP) .................................. 2010-034813
Mar. 30, 2010 (JP) .................................. 2010-078479

(51) Int. Cl.
*D06N 7/04* (2006.01)
*B29C 65/00* (2006.01)

(52) U.S. Cl.
USPC ............ 428/141; 156/230; 156/280; 156/239

(58) Field of Classification Search
None
See application file for complete search history.

(56) References Cited

U.S. PATENT DOCUMENTS

| | | | | |
|---|---|---|---|---|
| 5,279,689 | A | * | 1/1994 | Shvartsman .................. 156/220 |
| 6,312,566 | B1 | | 11/2001 | Iwaisaki et al. |
| 6,602,347 | B1 | | 8/2003 | Shimoda et al. |
| 8,133,533 | B2 | | 3/2012 | Nakagame et al. |
| 2008/0032144 | A1 | | 2/2008 | Hashimoto et al. |
| 2009/0196998 | A1 | | 8/2009 | Nakagame et al. |
| 2009/0324942 | A1 | | 12/2009 | Tsukahara et al. |

FOREIGN PATENT DOCUMENTS

| | | |
|---|---|---|
| EP | 2 085 496 | 10/2010 |
| JP | 60-17073 | 1/1985 |
| JP | 60-69830 | 4/1985 |
| JP | 08092727 | 4/1996 |
| JP | 2002-264274 | 9/2002 |
| JP | 2009-086022 | 4/2009 |
| JP | 2009-302029 | * 4/2009 |
| JP | 2009-179853 | 8/2009 |

OTHER PUBLICATIONS

Cover page of Office Action dated Jan. 31, 2013 in U.S. Appl. No. 13/075,747 with PTO-892 and PTO/SB/08a from IDS filed on Mar. 30, 2011.
"Elastic Properties and Young Modulus for some Materials" from engineeringtoolbox.com as captured by archive.org Jan. 17, 2013.
United States Office Action—U.S. Appl. No. 13/030,757—Apr. 24, 2013.

* cited by examiner

*Primary Examiner* — Maria Veronica Ewald
*Assistant Examiner* — Nicole T Gugliotta
(74) *Attorney, Agent, or Firm* — Young & Thompson (57) ABSTRACT

A manufacturing method of functional film comprising the steps of:
  a first step of feeding a lengthy substrate with self-support including a first laminate film on a back side, forming an organic film on a front side of the substrate while transferring the substrate, providing a second laminate film on a surface of the organic film, and taking up the substrate into a film roll; and
  a second step of loading the film roll on a vacuum deposition apparatus, continuously feeding the substrate including the first laminate film and the second laminate film from the film roll, removing the second laminate film while transferring the substrate, forming an inorganic film over the organic film of the substrate, and taking up the substrate into a film roll.

7 Claims, 8 Drawing Sheets

| TEST | THICKNESS OF SUBSTRATE (μm) | LAMINATE FILM ON BACK SIDE | THICKNESS OF LAMINATE FILM ON BACK SIDE (μm) | ATTACHMENT POSITION OF LAMINATE FILM ON BACK SIDE | ADHESION OF LAMINATE FILM ON BACK SIDE (N/25mm) | LAMINATE FILM ON ORGANIC FILM | ADHESION OF LAMINATE FILM ON ORGANIC FILM (N/25mm) | REMOVAL POSITION OF LAMINATE FILM ON ORGANIC FILM | STEPPED ROLLER | THICKNESS OF ORGANIC FILM (μm) | THICKNESS OF INORGANIC FILM (nm) | BARRIER PROPERTY (g/m²·day) | EVALUATION RESULT |
|---|---|---|---|---|---|---|---|---|---|---|---|---|---|
| 1 | 25 | ABSENT | — | — | — | ABSENT | — | — | ABSENT | 1 | 50 | 6.2×10⁻³ | × |
| 2 | 50 | ABSENT | — | — | — | ABSENT | — | — | ABSENT | 1 | 50 | 4.3×10⁻³ | × |
| 3 | 100 | ABSENT | — | — | — | ABSENT | — | — | ABSENT | 1 | 50 | 3.2×10⁻⁴ | △ |
| 4 | 50 | PRESENT | 5 | BEFORE APPLICATION | 0.05 | PRESENT | 0.02 | IMMEDIATELY BEFORE DEPOSITION | ABSENT | 1 | 50 | 2.4×10⁻⁴ | △ |
| 5 | 50 | PRESENT | 25 | BEFORE APPLICATION | 0.05 | PRESENT | 0.02 | IMMEDIATELY BEFORE DEPOSITION | ABSENT | 1 | 50 | 1.8×10⁻⁴ | ○ |
| 6 | 50 | PRESENT | 50 | BEFORE APPLICATION | 0.05 | PRESENT | 0.02 | IMMEDIATELY BEFORE DEPOSITION | ABSENT | 1 | 50 | 1.2×10⁻⁴ | ○ |
| 7 | 50 | PRESENT | 50 | BEFORE APPLICATION | 0.05 | PRESENT | 0.01 | IMMEDIATELY BEFORE DEPOSITION | ABSENT | 1 | 50 | 9.1×10⁻⁵ | ◎ |
| 8 | 50 | PRESENT | 50 | BEFORE APPLICATION | 0.05 | PRESENT | 0.04 | IMMEDIATELY BEFORE DEPOSITION | ABSENT | 1 | 50 | 1.7×10⁻⁴ | ○ |
| 9 | 50 | PRESENT | 50 | BEFORE APPLICATION | 0.05 | PRESENT | 0.06 | IMMEDIATELY BEFORE DEPOSITION | PRESENT | 1 | 50 | 1.8×10⁻⁴ | ○ |
| 10 | 50 | PRESENT | 50 | BEFORE APPLICATION | 0.05 | PRESENT | 0.07 | IMMEDIATELY BEFORE DEPOSITION | ABSENT | 1 | 50 | 2.2×10⁻⁴ | △ |
| 11 | 50 | PRESENT | 50 | BEFORE APPLICATION | 0.01 | PRESENT | 0.02 | IMMEDIATELY BEFORE DEPOSITION | ABSENT | 1 | 50 | 3.1×10⁻⁴ | △ |
| 12 | 50 | PRESENT | 50 | BEFORE APPLICATION | 0.02 | PRESENT | 0.02 | IMMEDIATELY BEFORE DEPOSITION | ABSENT | 1 | 50 | 1.9×10⁻⁴ | ○ |
| 13 | 50 | PRESENT | 50 | BEFORE APPLICATION | 0.06 | PRESENT | 0.02 | IMMEDIATELY BEFORE DEPOSITION | ABSENT | 1 | 50 | 9.2×10⁻⁵ | ◎ |
| 14 | 50 | PRESENT | 50 | BEFORE APPLICATION | 0.05 | PRESENT | 0.02 | DEPOSITION FEEDING | ABSENT | 1 | 50 | 2.9×10⁻⁴ | △ |
| 15 | 50 | PRESENT | 50 | AFTER APPLICATION | 0.05 | PRESENT | 0.02 | IMMEDIATELY BEFORE DEPOSITION | ABSENT | 1 | 50 | 2.5×10⁻⁴ | △ |
| 16 | 25 | ABSENT | — | — | — | ABSENT | — | — | PRESENT | 1 | 50 | 9.2×10⁻³ | × (OR BELOW) |
| 17 | 50 | PRESENT | 50 | BEFORE APPLICATION | 0.05 | PRESENT | 0.02 | IMMEDIATELY BEFORE DEPOSITION | PRESENT | 1 | 50 | 1.1×10⁻⁴ | ◎ |
| 18 | 50 | PRESENT | 5 | BEFORE APPLICATION | 0.05 | ABSENT | — | — | PRESENT | 1 | 50 | 2.3×10⁻³ | × |

FIG. 9

| CONDITION | ADHESION OF SECOND LAMINATE FILM (N/25mm) | ADHESION OF FIRST LAMINATE FILM (N/25mm) | ROUGHNESS OF SECOND LAMINATE FILM (Ra nm) | ROUGHNESS OF FIRST LAMINATE FILM (Ra nm) | YOUNG'S MODULUS OF SECOND LAMINATE FILM (Gpa) | YOUNG'S MODULUS OF FIRST LAMINATE FILM (Gpa) | MOISTURE PERMEABILITY (g/m² · day) | EVALUATION |
|---|---|---|---|---|---|---|---|---|
| 19 | 0.02 | 0.05 | 20 | 30 | 0.2 | 2 | $8.5 \times 10^{-5}$ | ◎ |
| 20 | 0.05 | 0.05 | 20 | 30 | 0.2 | 2 | $2.1 \times 10^{-4}$ | △ |
| 21 | 0.02 | 0.03 | 20 | 30 | 0.2 | 2 | $1.6 \times 10^{-4}$ | ○ |
| 22 | 0.02 | 0.05 | 50 | 30 | 0.2 | 2 | $2.2 \times 10^{-4}$ | △ |
| 23 | 0.02 | 0.05 | 5 | 30 | 0.2 | 2 | $1.8 \times 10^{-4}$ | ○ |
| 24 | 0.02 | 0.05 | 20 | 50 | 0.2 | 2 | $1.7 \times 10^{-4}$ | ○ |
| 25 | 0.02 | 0.05 | 20 | 80 | 0.2 | 2 | $2.1 \times 10^{-4}$ | △ |
| 26 | 0.02 | 0.05 | 20 | 5 | 0.2 | 2 | $1.6 \times 10^{-4}$ | ○ |
| 27 | 0.02 | 0.05 | 20 | 30 | 0.5 | 2 | $1.1 \times 10^{-4}$ | ○ |
| 28 | 0.02 | 0.05 | 20 | 30 | 2 | 2 | $1.9 \times 10^{-4}$ | ○ |
| 29 | 0.02 | 0.05 | 20 | 30 | 4 | 4 | $3.5 \times 10^{-4}$ | △ |
| 30 | 1.0 | 1.0 | 20 | 30 | 0.2 | 2 | $2.8 \times 10^{-4}$ | △ |
| 31 | 1.0 | 1.5 | 20 | 30 | 0.2 | 2 | $2.9 \times 10^{-4}$ | △ |

FUNCTIONAL FILM

BACKGROUND OF THE INVENTION

1. Field of the Invention

The present invention relates to a manufacturing method of functional film and a functional film, and particularly, to a manufacturing method of functional film, on which an organic film and an inorganic film are deposited on a substrate, and a functional film.

2. Description of the Related Art

Various functional films, such as gas barrier films, protective films, optical filters, anti-reflective films, and other optical films, are used in various apparatuses, such as optical elements, display devices such as liquid crystal displays and organic EL displays, semiconductor devices, and thin-film solar cells.

Deposition techniques based on vacuum deposition methods, such as sputtering and plasma CVD, are used to manufacture the functional films. A so-called roll-to-roll technique for continuous deposition on a lengthy substrate is implemented to efficiently manufacture the functional films with high productivity. Japanese Patent Application Laid-Open No. 8-92727 discloses an example of a manufacturing method of functional film (for example, barrier film), in which acrylate monomer, etc., is applied to a substrate that is continuously driven, the film is taken up into a roll after drying and curing, the roll including an organic film is fed to a vacuum deposition apparatus, and an inorganic film is deposited on the organic film.

Japanese Patent Application Laid-Open No. 2009-86022 discloses heating at least one of protective films at a predetermined temperature range in a polarizing plate including the protective films on both sides of a polarizing film. As a result, a polarizing plate with excellent dimensional stability can be obtained for a long time. The protective films of Japanese Patent Application Laid-Open No. 2009-86022 is used to protect a completed product (polarizing plate).

Japanese Patent Application Laid-Open No. 8-92727 discloses a method of setting a film roll of roll hardness 70 to 95 on a feeding unit of a vacuum deposition apparatus and continuously depositing inorganic films on a substrate to uniform the quality of the functional films by preventing a roll gap in the deposition of inorganic films.

However, even if the film roll including the organic films is taken up at the roll hardness 70 to 95, the film roll takes in entrained air when the substrate is taken up. If the film roll with the entrained air is set to the feeding unit of the vacuum deposition apparatus with reduced pressure, the entrained air in the film roll comes out.

As a result, the balance of stress (tension and friction) inside the film roll during take-up is lost, and the film roll makes a motion of "tight winding (roll diameter shrinkage)".

When the "tight winding" occurs, the organic film on the substrate may be rubbed against the back side of the substrate on the upper side or may touch the dust attached on the back side of the substrate in the film roll. Therefore, minute explosions of film occur in the organic film, and the smoothness is lost. If the substrate is transferred and the inorganic film is deposited on the organic film, a deposition failure occurs, and there is a problem of cracks or holes in the inorganic film.

Furthermore, the performance of the functional film is affected if the organic film or the inorganic film touches the guide roller when the guide roller transfers the substrate including the organic film or the inorganic film deposited in the vacuum deposition apparatus. Since there is no entrained air in the vacuum deposition apparatus as opposed to the atmosphere, the contact, i.e. friction, with the guide roller is large. Minute film destructions occur if the organic film touches the guide roller before the deposition of the inorganic film. If the inorganic film touches the guide roller after the deposition of the inorganic film, minute scratches occur because the inorganic film is significantly thin, and there is a problem that the barrier performance is lost.

If the used substrate is thin and soft, deflections and vertical wrinkles easily occur in a width direction depending on the tension necessary for the transfer. As a result, force is applied to a location where the guide roller and the substrate locally contact, and the organic films and the inorganic films are easily broken. Furthermore, if a fold occurs in the substrate, there is a problem that a crack easily occurs in the organic film and the inorganic film.

To solve the problems, there can be a method of supporting only the edges of the substrate and transferring the substrate without touching the deposition surface. The vertical wrinkles of the substrate increase due to the tension if the substrate is thin. Therefore, the productivity needs to be significantly reduced by very slowly transferring the substrate or by enlarging the area of the supported part.

Meanwhile, in view of the productivity, cost, and use applications, the reduction in the thickness is strongly demanded in relation to the type and thickness of the substrate. In the deposition method of the inorganic film, such as a barrier film, there is also a step of exposing the substrate to a heat source. Therefore, the substrate needs to be cooled from the opposite side (back side) of the deposition side. A cooling drum and the substrate are adhered to cool the substrate, and it is important to control the tension of the substrate during transfer.

A problem of the thin functional film, such as a barrier film, using the roll-to-roll technique is that the functional layer of the functional film needs to be protected during a deposition/transfer process, during a storage/transport process, and during an assembly process.

As for the characteristics of laminate films to be used, vertical wrinkles or folds of the substrate during transfer, take-up to the film roll, prevention of scratches on the inorganic films, etc., need to be taken into consideration when a plurality of organic films and inorganic films are laminated on the substrate to form the functional layer. Protection of the functional layer also needs to be taken into consideration when the completed functional film is laminated on another product.

SUMMARY OF THE INVENTION

The present invention has been made in view of the circumstances, and the present invention provides a manufacturing method of a high-quality functional film with high productivity.

Furthermore, the present invention has been made in view of the circumstances, and the present invention provides a functional film including laminate films capable of solving the problems in the deposition/transfer process, the storage/transport process, and the assembly process.

To attain the objects, the present invention provides a manufacturing method of functional film comprising the steps of: a first step of feeding a lengthy substrate with self-support including a first laminate film on a back side, forming an organic film on a front side of the substrate while transferring the substrate, providing a second laminate film on a surface of the organic film, and taking up the substrate into a film roll; and a second step of loading the film roll on a vacuum deposition apparatus, continuously feeding the substrate including the first laminate film and the second laminate film from the film roll, removing the second laminate film while transferring the substrate, forming an inorganic film over the organic film of the substrate, and taking up the substrate into a film roll.

According to the present invention, since the substrate includes the first laminate film on the back side, the substrate is self-supported. Vertical wrinkles and folds are unlikely to be generated on the substrate because of the self-support even if the substrate is transferred under tension. Therefore, defects, such as holes and cracks, of the organic film and the inorganic film caused by the vertical wrinkles and the folds can be prevented. Furthermore, local contact between the substrate and the guide roller caused by the vertical wrinkles and the folds can be prevented. High-quality functional films with fewer defects can be obtained.

According to the present invention, after the organic film is formed on the substrate, the second laminate film is provided to the surface of the organic film, and the substrate is taken up as the film roll. The film roll including the second laminate film is set to the vacuum deposition apparatus. Even if there is tight winding in the film roll after the evacuation, the organic film is not damaged because of the protection by the second laminate film. The substrate is transferred to the vacuum deposition apparatus while the second laminate film protects the organic film until the deposition of the inorganic film. Therefore, the organic film is not damaged by the transfer. As a result, the inorganic film can be formed on a smooth organic film.

Preferably, the present invention provides the manufacturing method of functional film, wherein a total thickness of the first laminate film and the substrate is 75 µm or more.

Preferably, the present invention provides the manufacturing method of functional film, wherein adhesion of the first laminate film is 0.01N/25 mm or more.

Preferably, the present invention provides the manufacturing method of functional film, wherein adhesion of the second laminate film is 0.06N/25 mm or less.

Preferably, the present invention provides the manufacturing method of functional film, wherein a pass roller supports edges of at least one of the back side of the substrate and the front side of the substrate to transfer the substrate in the first and second steps.

Preferably, the present invention provides the manufacturing method of functional film, further comprising a step of improving adhesion between the substrate and the first laminate film before deposition of the inorganic film on the substrate.

Preferably, the present invention provides the manufacturing method of functional film, wherein thickness of the inorganic film is 5 nm or more and 200 nm or less.

Preferably, the present invention provides the manufacturing method of functional film, wherein the inorganic film contains a metal selected from the group consisting of metal, metal oxide, metal nitride, metal carbide, metal fluoride, and composites thereof.

Preferably, the present invention provides the manufacturing method of functional film, wherein the organic film contains one of radiation-curing monomer and oligomer.

An aspect of the present invention provides a functional film comprising: a substrate; a functional layer including at least one organic film and at least one inorganic film that are alternately arranged on one side of the substrate; a first laminate film arranged on the other side of the substrate; and a second laminate film arranged on a top layer of the functional layer, wherein adhesion between the second laminate film and the top layer is less than adhesion between the first laminate film and the substrate.

The first laminate film prevents vertical wrinkles and folds of the substrate during a deposition/transfer process using roll-to-roll. The second laminate film prevents the top layer of the functional layer during a storage/transport process. Since the adhesion of the second laminate film is weaker than the adhesion of the first laminate film, the second laminate film can be easily removed upon attachment to another product (during assembly process).

Preferably, according to another aspect of the present invention, Young's modulus of the second laminate film is less than Young's modulus of the first laminate film. Since the Young's modulus of the second laminate film is low, wrinkles are not generated on the first laminate film due to an influence of the tension of the second laminate film being removed when the second laminate film is peeled off first.

In the step of peeling off the second laminate film, the substrate and the first laminate film provided to the substrate are held (fixed) by something. If the Young's modulus of the second laminate film is greater than the Young's modulus of the first laminate film stretched to obtain the self-support of the substrate, the first laminate film with low Young's modulus may be pulled (tension of being peeled off) and bent. Since the Young's modulus of the second laminate film is low, the destruction of the first laminate film can be prevented.

Preferably, according to another aspect of the present invention, the adhesion between the second laminate film and the top layer is in a range of 0.02 to 1.0 (N/25 mm), and the adhesion between the first laminate film and the substrate is in a range of 0.03 to 1.5 (N/25 mm).

As a result of setting the adhesion of the second laminate film within the range, removal during the storage/transport process can be prevented, and the second laminate film can be removed during the assembly process. As a result of setting the adhesion of the first laminate film within the range, removal during the deposition/transfer process can be prevented, and folds, wrinkles, etc., upon the removal can also be prevented.

Preferably, according to another aspect of the present invention, center line average roughness (Ra) of the second laminate film is 5 to 50 nm, and center line average roughness (Ra) of the first laminate film is 5 to 80 nm.

As a result of setting the center line average roughness (Ra) of the second laminate film within the range, scratches on the top layer of the functional layer by the second laminate film can be prevented in the storage/transport process. As a result of setting the center line average roughness (Ra) of the first laminate film within the range, scratches on the inorganic film by the first laminate film can be prevented when the substrate is taken up into a film roll in the deposition/transfer process.

Preferably, according to another aspect of the present invention, thickness of the inorganic film is 200 nm or less.

Preferably, according to another aspect of the present invention, the inorganic film contains a material selected from the group consisting of metal, metal oxide, metal nitride, metal carbide, metal fluoride, and composites thereof.

Preferably, according to another aspect of the present invention, the organic film contains one of radiation-curing monomer and oligomer.

According to the manufacturing method of the present invention, a high-quality functional film with high productivity can be obtained.

Furthermore, according to the present invention, a high-quality functional film can be obtained during a deposition/transfer process, during a storage/transport process, and during an assembly process.

DETAILED DESCRIPTION OF THE PREFERRED EMBODIMENTS

Preferred embodiments of the present invention will be described along with the attached drawings. Although the present invention will be described by the following preferred embodiments, changes can be made by a multiplicity of methods without departing from the scope of the present invention, and embodiments other than the present embodiments can be used. Therefore, all changes within the scope of the present invention are included in the claims. Numeric value ranges expressed by "to" in the present specification denote ranges including numeric values before and after "to".

First Embodiment

Figure 1:
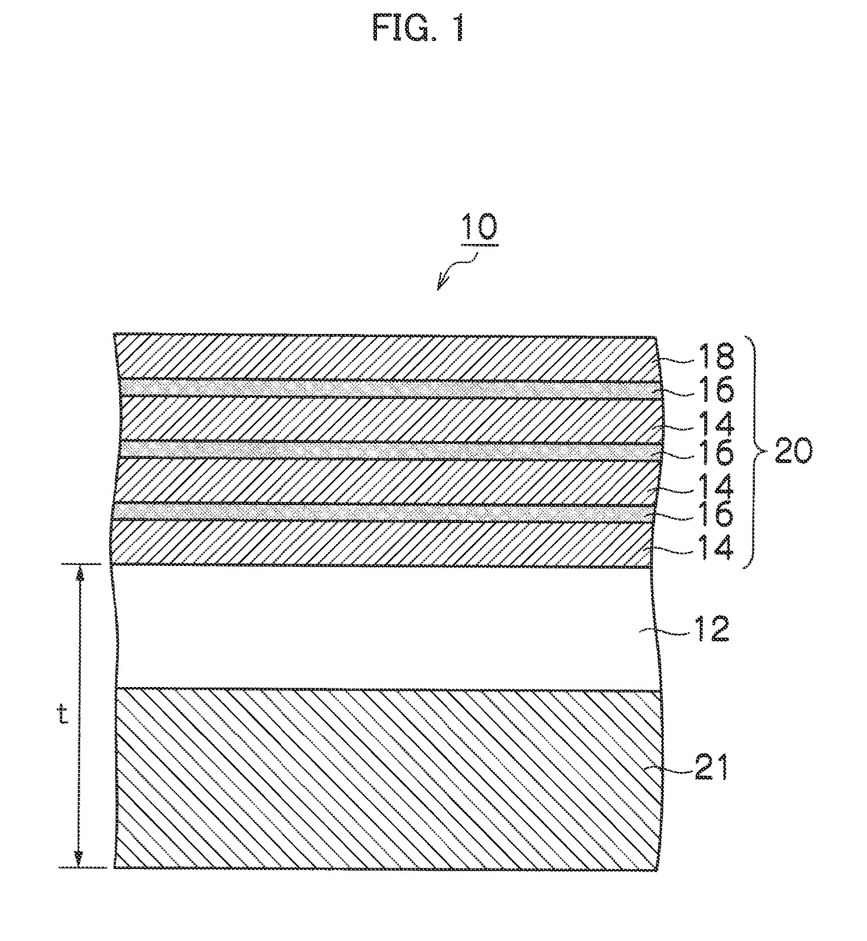
FIG. 1 is a configuration diagram of a functional film.

FIG. 1 shows an example of a configuration diagram of a functional film manufactured by a manufacturing method of the present invention. As shown in FIG. 1, a functional film 10 includes organic films 14 deposited on the front side of a substrate 12 and inorganic films 16 deposited on the organic films 14. In the functional film 10 shown in FIG. 1, a combination of two layers, the organic film 14 and the inorganic film 16, is repeated three times. The functional film 10 includes an organic film 18 at the outermost layer. The organic films 14, the inorganic films 16, and the organic film 18 function as a functional layer 20. The organic film 18 as the top layer also functions as a protection layer. The structure of the organic films 14 and the inorganic films 16 deposited on the front side of the substrate 12 is not limited to the structure described above. The deposition in the order of the inorganic film and the organic film on the front side of the substrate 12 is also possible.

A first laminate film 21 is attached to the back side of the substrate 12. The attachment of the first laminate film 21 provides self-support to the composite of the substrate 12 and the first laminate film 21. It is preferable that a total thickness t of the substrate 12 and the first laminate film 21 is 75 μm or more. The self-support of the composite of the substrate 12 and the first laminate film 21 can be secured if the total thickness t is 75 μm or more.

The self-support denotes the elasticity (rigidity) of the film, and the dimension of the self-support is defined by a product of the Young's modulus (GPa) and a cube of the film thickness (μm). In the case of a composite in which the laminate film is attached to the substrate, the self-support is defined by a product of an average value (GPa) of the Young's modulus (GPa) of the substrate and the Young's modulus (GPa) of the laminate film and a cube of the total thickness (μm) of the composite. The range of the self-support necessary in the present embodiment is 2 (GPa)×100 (μm)$^3$ to 6 (GPa)×200 (μm)$^3$.

The substrate 12 is not particularly limited if the deposition of the organic films 14 and the inorganic films 16 by vacuum deposition is possible. Various substrates used in functional films, such as PET films and various other resin films as well as aluminum sheets and various other metal sheets, can be used.

PE, PET, PEN, PC, COP, etc., can be used as the first laminate film 21 if the self-support can be provided to the substrate 12. As described below, the first laminate film 21 can be included on the back side of the substrate 12 at the deposition of the inorganic films 16 by vacuum deposition. When the first laminate film 21 is removed from the substrate 12, it is preferable that the adhesive strength between the substrate 12 and the first laminate film 21 is weaker than the adhesive strength between the organic film 14 or the inorganic film 16, which is deposited on the front side of the substrate 12, and the substrate 12. It is preferable that the adhesion of the first laminate film 21 is 0.01N/25 mm or more. The first laminate film 21 may be peeled off during transfer if the adhesion of the first laminate film 21 is weak, and the transfer may be hindered. The removal of the first laminate film 21 during transfer can be prevented by setting the adhesion of the first laminate film 21 equal to or greater than the value.

Examples of the organic films 14 include all films, such as an anchor coat layer for improving the adhesion, an oxide film deposited by atmospheric pressure plasma, and a thermosetting or UV-curing organic film, that are deposited before the deposition of the inorganic films.

It is preferable that the inorganic films 16 include at least one of or a composite of metal, metal oxide, metal nitride, metal carbide, and metal fluoride.

The functional film 10 with a predetermined function can be obtained by forming the inorganic film 16 or a laminated body (the functional layer 20) of the inorganic films 16 and the organic films 14 on the front side of the substrate 12.

A manufacturing method of functional film according to the embodiment will be described. A manufacturing apparatus that manufactures the functional film includes, for example, an organic film deposition apparatus 23 that deposits an organic film on the front side of the substrate 12 and a vacuum deposition apparatus 24 that deposits an inorganic film on the organic film.

Figure 2A:
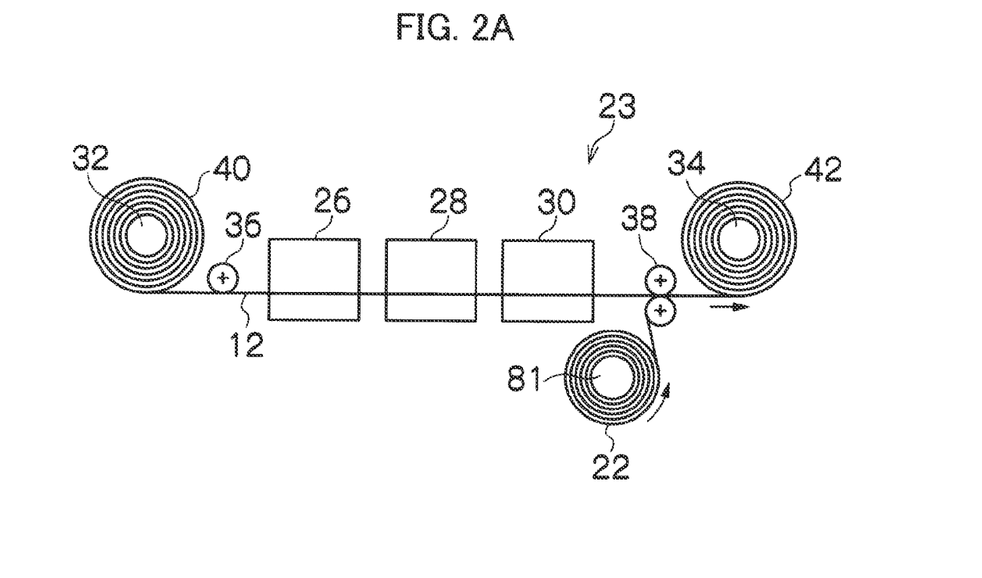
FIGS. 2A and 2B are diagrams showing an example of an apparatus that carries out a manufacturing method of functional film.

FIG. 2A conceptually shows an example of the organic film deposition apparatus 23. The organic film deposition apparatus 23 includes a coating device 26, a heating device 28, and a UV irradiation apparatus 30. The organic film deposition apparatus 23 deposits the organic film by roll-to-roll. A film roll 40 is first loaded on a feeding device 32. A take-up roller 36 then transfers the substrate 12 in a longitudinal direction from the film roll 40. The coating device 26 applies, for example, a coating solution containing prepared radiation-curing monomer or oligomer to the substrate 12.

The heating device 28 dries the coating solution and evaporates the solvent. The UV irradiation apparatus 30 applies an ultraviolet ray to the coating solution after drying to start polymerization reaction. The organic film 14 is hardened and deposited on the substrate 12. A laminate film feeding device 81 feeds a second laminate film 22. A pair of nip rollers 38 attach the second laminate film 22 to the surface of the organic film 14. A take-up device 34 takes up the substrate 12 as a film roll 42. At this point, the take-up tension of the substrate 12 is controlled.

In the present embodiment, the first laminate film 21 is included on the back side, and the self-supported substrate 12 is taken up into a roll shape and prepared as the film roll 40. The first laminate film 21 provides the self-support to the substrate 12. Therefore, vertical wrinkles, folds, etc., are not generated on the substrate 12 when the substrate 12 is transferred from the feeding device 32 to the take-up device 34. This can prevent the organic film deposited on the substrate 12 from being destroyed. Particularly, the prevention of the destruction of the organic film before the deposition of the inorganic film can prevent generation of a deposition failure area (i.e. defect) on the inorganic film.

The first laminate film 21 is attached to the substrate before the application of the organic film in the present embodiment. The first laminate film 21 can also be attached to the substrate after the application of the organic film. Once the first laminate film 21 is attached to the back side of the substrate, the first laminate film 21 is not removed from the substrate 12 until required number of organic films and inorganic films are laminated on the substrate 12.

The second laminate film 22 is attached after the deposition of the organic film, and the second laminate film 22 protects the surface of the organic film. It is preferable that the adhesion of the second laminate film 22 is 0.06N/25 mm or less. The second laminate film 22 is removed before the deposition of the inorganic film. The second laminate film 22 can be surely removed if the adhesion is 0.06N/25 mm or less.

PE (high-density PE or low-density PE), PET, etc., can be used as a material of the second laminate film 22. Particularly, it is preferable to use PE from the viewpoint of price and productivity.

Figure 2B:
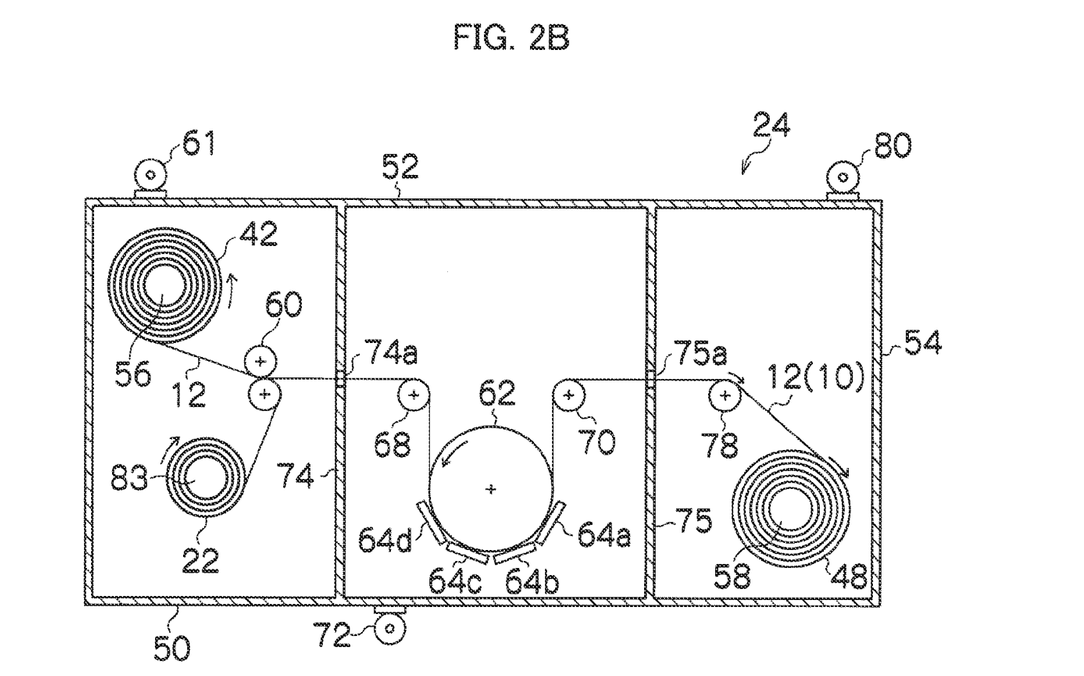

Like the organic film deposition apparatus 23, the vacuum deposition apparatus 24 is an apparatus that forms an inorganic film by roll-to-roll as shown in FIG. 2B. The vacuum deposition apparatus 24 includes a feed chamber 50, a deposition chamber 52, and a take-up chamber 54. A feeding device 56 of the feed chamber 50 feeds the substrate 12 from the film roll 42. The inorganic film 16 is deposited on the organic film 14 of the substrate 12 in the deposition chamber 52 while the substrate 12 is transferred in the longitudinal direction. A take-up device 58 of the take-up chamber 54 takes up the substrate 12, on which a laminated body including the organic film 14 and the inorganic film 16 is deposited, into a film roll 48.

A deposition method of the inorganic film will be described. The feed chamber 50 of the vacuum deposition apparatus 24 includes the feeding device 56, a guide roller 60, an evacuation device 61, and a laminate film take-up device 83. The film roll 42 formed by winding the substrate 12 is loaded on the feeding device 56. The organic film deposition apparatus 23 deposits the organic film 14 on the front side of the substrate 12, while the first laminate film 21 is attached to the back side of the substrate 12. The evacuation device 61 reduces the pressure of the feed chamber 50. The reduction in the pressure causes tight winding of the film roll 42. Since the second laminate film 22 is attached to the surface of the organic film 14 in the present embodiment, the organic film 14 can be protected from scratches of rubbing caused by the tight winding.

The feeding device 56 feeds the substrate 12 from the film roll 42. The laminate film take-up device 83 takes up the second laminate film 22 from the substrate 12 before the substrate 12 is transferred to the deposition chamber 52. The guide roller 60 guides the substrate 12 including the exposed organic film 14 to pass through a predetermined path and through a slit 74a of a partition 74, and the substrate 12 is transferred to the deposition chamber 52. A driving source not shown rotates the feeding device 56 counter-clockwise in FIG. 2B in the feed chamber 50. Since the first laminate film 21 is attached to the back side of the substrate 12, the substrate 12 is self-supported.

The inorganic film 16 is deposited on the front side of the substrate 12, i.e. on the surface of the organic film 14, in the deposition chamber 52. As shown in FIG. 2B, the deposition chamber 52 includes a drum 62, deposition devices 64a, 64b, 64c, and 64d, guide rollers 68 and 70, and an evacuation device 72. If the deposition chamber 52 is designed to form a film by sputtering, plasma CVD, etc., a high-frequency power source, etc., is further installed in the deposition chamber 52.

A driving source not shown rotates the drum 62 of the deposition chamber 52 counterclockwise in FIG. 2B around the center line. The substrate 12 guided to a predetermined path by the guide roller 68 is wound around a predetermined area in the peripheral surface of the drum 62, and the drum 62 supports and guides the substrate 12 to transfer the substrate 12 through a predetermined transfer path. The deposition devices 64a to 64d deposit an inorganic film on the organic film 14. It is preferable that the thickness of the inorganic film 16 deposited at this time is 5 nm to 200 nm.

The deposition devices 64a to 64d are devices that deposit an inorganic film on the front side of the substrate 12 by a vacuum deposition method. The deposition device is not limited, and all known vacuum deposition methods (vapor deposition methods), such as CVD, plasma CVD, sputtering, vacuum deposition, and ion plating, can be used.

Therefore, the deposition devices 64a to 64d are constituted by various members corresponding to the implemented vacuum deposition method. For example, if the deposition chamber 52 is designed to form the inorganic film 16 by the ICP-CVD method (inductively coupled plasma CVD), the deposition devices 64a to 64d include an induction coil that forms an inductive field, a gas feeding device that feeds a reaction gas to the deposition area, etc.

If the deposition chamber 52 is designed to form the inorganic film 16 by the CCP-CVD method (capacitively coupled plasma CVD), the deposition devices 64a to 64d include a shower electrode, etc. The shower electrode is hollow and includes a multiplicity of small holes on the surface opposing the drum 62. The shower electrode is connected to a source of the reaction gas and functions as a high-frequency electrode and a reaction gas feeding device.

If the deposition chamber 52 is designed to form the inorganic film 16 by vapor phase deposition based on the CVD method, the deposition devices 64a to 64d include an introduction device of the reaction gas, etc.

If the deposition chamber 52 is designed to form the inorganic film 16 by sputtering, the deposition devices 64a to 64d include a target holding device, a high-frequency electrode, a feeding device of a sputter gas, etc.

The evacuation device 72 evacuates the deposition chamber 52 to set a degree of vacuum corresponding to the deposition of the inorganic film 16 based on the vacuum deposition method. The evacuation device 72 is not particularly limited, and various vacuum pumps, such as a turbo pump, a mechanical booster pump, and a rotary pump, as well as known (vacuum) evacuation devices used in the vacuum deposition apparatus using an auxiliary device, such as a cryogenic coil, an adjustment device of the attained degree of vacuum or emission, etc., can be used.

After the deposition of the inorganic film 16 by the deposition devices 64a to 64d, guide rollers 70 and 78 guide the substrate 12 to a slit 75a of the partition 75, and the substrate 12 is transferred to the take-up chamber 54. An evacuation device 80 is arranged in the take-up chamber 54. The evacuation device 80 reduces the pressure to set a predetermined pressure in the take-up chamber 54. The take-up device 58 arranged in the take-up chamber 54 takes up the substrate 12 into the film roll 48.

In addition to the illustrated members, transfer devices that transfer the substrate 12 in a predetermined path may be arranged in the feed chamber 50, such as a pair of transfer rollers and a guide member that restricts the position of the substrate 12 in the width direction.

Providing the first laminate film 21 to the back side of the substrate 12 allows the substrate 12, on which the inorganic film 16 is deposited, to have appropriate rigidity. The substrate 12 can be transferred without the generation of vertical wrinkles and folds when the vacuum deposition apparatus 24 is transferred (or moved back and forth for a plurality of times). A defect of the inorganic film 16 caused by a deposition failure can be prevented, and the inorganic film 16 with excellent quality can be obtained.

Figure 3A:
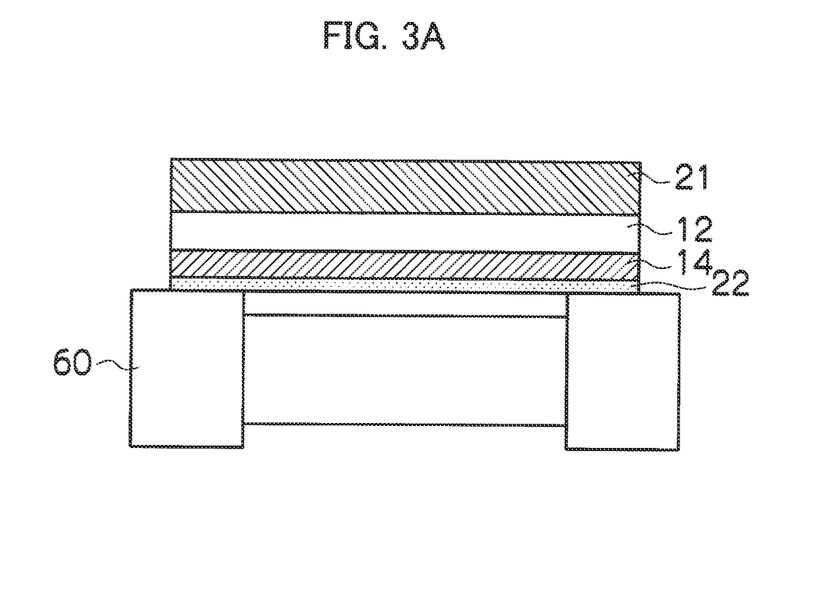
FIGS. 3A and 3B are conceptual diagrams showing states of transfer by stepped rollers.
Figure 3B:
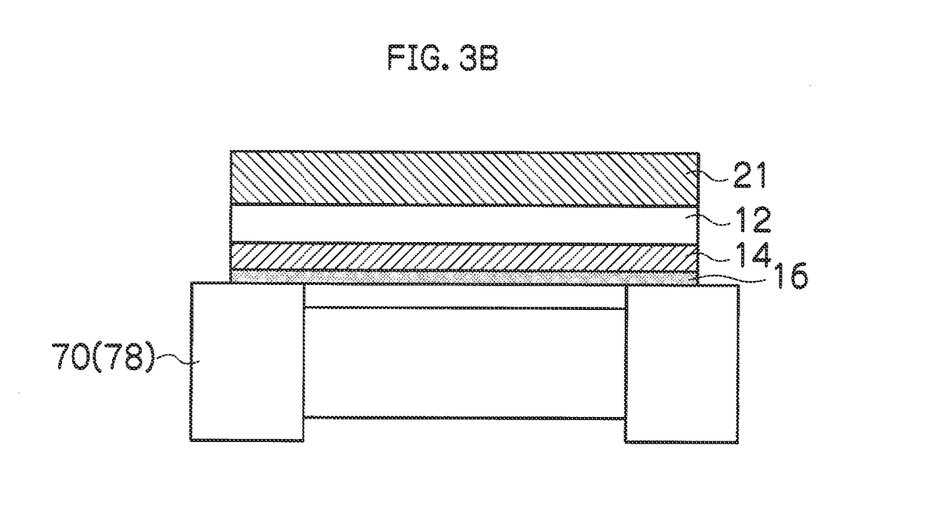

FIGS. 3A and 3B show states of transfer of the substrate in the vacuum deposition apparatus. In the vacuum deposition apparatus, it is preferable to transfer the substrate 12 by a stepped guide roller that touches only the edges of the substrate 12 (edges in a direction (width direction) orthogonal to the transfer direction). In general, not everything up to the edges of the functional film 10 including various films on the substrate 12 is used as a product. Sections near the edges are cut, or the edges do not have to function as the functional film 10 even if the edges are used. This is because there is no problem as a product even if the performance or characteristics of the edges of the functional film 10 are deteriorated or degraded.

FIG. 3A shows a state of transfer of the substrate 12 before the deposition of the inorganic film in the feed chamber 50. The diameters at both ends of the stepped guide roller 60 are greater than the diameter at the center. The second laminate film 22 attached to the organic film 14 is in contact only at both ends of the guide roller 60 and the area (function expression section) that is actually used as the product is not in contact with the guide roller 60. Particularly, since the laminate film 21 is attached to the back side of the substrate 12, vertical wrinkles and folds are unlikely to be generated on the substrate 12 even if tension is applied. The performance and characteristics of the organic film 14 at the function expression section are not degraded, and excellent surface smoothness and surface property are attained. Therefore, the performance of the inorganic film 16 deposited on the organic film 14 is not lost. The second laminate film 22 protects the organic film 14, and damage of the organic film 14 during transfer of the substrate 12 can be prevented.

FIG. 3B shows a state of transfer of the substrate 12 after the deposition of the inorganic film. The diameters at both ends of the stepped guide rollers 70 and 78 are greater than the diameters at the centers. The inorganic film 16 is in contact only at both ends of the guide rollers 70 and 78, and the function expression section of the inorganic film 16 is not in contact with the guide rollers 70 and 78. Since the first laminate film 21 is attached to the back side of the substrate 12, vertical wrinkles and folds are unlikely to be generated on the substrate 12. Therefore, the performance and characteristics of the inorganic film 16 at the function expression section is not degraded due to a crack, etc.

Since the first laminate film 21 provides the self-support to the substrate 12, the transfer speed of the substrate 12 can be increased even if the substrate is supported only at the edges of the stepped guide rollers. Furthermore, the stability can be significantly improved.

In general, when the stepped guide rolls are used, the tension of the transfer cannot be increased because of the steps. Particularly, the center is easily deflected if there is no self-support in the substrate, and the upper limit of the tension becomes lower. Meanwhile, the tension needs to be increased to prevent slips to speed up the transfer. Increasing the self-support by the first laminate film 21 on the back side of the substrate 12 can prevent the deflection when the tension is applied and can increase the transfer speed of the substrate 12. Since the self-support is high, there is less deformation at the stepped sections. Meandering and tension variations are not generated, and the stability (accuracy) of transfer improves.

As shown in FIG. 2B, the substrate 12 including the deposited inorganic film 16 is taken up into the film roll 48 in the take-up chamber 54. The film roll 48 is set as the film roll 40 in the feeding device 32 of the organic film deposition apparatus 23, and the organic film 14 is deposited on the inorganic film 16. The second laminate film 22 is attached to the substrate 12 on which the organic film 14, the inorganic film 16, and the organic film 14 are deposited. The second laminate film 22 protects the front side of the organic film 14 as a top layer. After the attachment of the second laminate film 22, the take-up device 34 takes up the substrate 12 into the film roll 42.

The film roll 42 is then loaded on the feed chamber 50 of the vacuum deposition apparatus 24. The inorganic film 16 is deposited on the substrate 12. A desired functional film is manufactured through a plurality of times of the deposition step of the organic film 14 and the deposition step of the inorganic film 16. The deposition of the organic material and the deposition of the inorganic material are repeated three times, and the organic material is further deposited on the outermost layer to manufacture the functional film 10 shown in FIG. 1.

After predetermined organic films 14 and inorganic films 16 are deposited on the substrate 12, the first laminate film 21 can be removed from the substrate 12. This is because the first laminate film 21 is attached to the back side of the substrate 12 to secure the self-support in the deposition step, not to protect the substrate 12.

As compared to a mode of thickening the substrate to provide the self-support, the first laminate film 21 is attached to provide the self-support in the present embodiment. Therefore, the first laminate film 21 can be peeled off during processing of the product after the creation of the functional film 10, and the thickness of the substrate 12 can be adjusted. As compared to the mode of thickening the substrate which leads to an increase in the unit price, the attachment of the first laminate film 21 to provide the self-support allows manufacturing the functional film with low cost, because the substrate 12 is not thickened. Since the first laminate film 21 is attached to provide the self-support, the transfer speed can be increased, and the functional film can be manufactured without reducing the production efficiency when thinning of the substrate 12 is required.

Particularly, attachment of foreign matters on a smooth surface of the substrate 12 before the deposition of the inorganic film 16 has a large effect on a formation failure of the inorganic film 16 afterwards. The smooth surface of the substrate 12 denotes the surface of the organic film 14 when the organic film 14 is deposited on the substrate 12. An increase in the transfer accuracy is needed to protect the substrate 12 before the deposition of the inorganic film 16. To increase the transfer accuracy, the first laminate film 21 needs to be attached not only from the viewpoint of protection, but also from the viewpoint of the self-support (rigidity). The total thickness of the substrate 12 and the first laminate film 21 is also important. The second laminate film 22 further protects the surface of the organic film 14. Therefore, the smoothness of the surface of the organic film 14 before the formation of the inorganic film 16 can be maintained.

It is preferable that there is a step of improving the adhesive strength between the substrate 12 and the first laminate film 21 before the deposition of the inorganic film 16. It is preferable that the step of improving the adhesive strength includes a heating zone and an ultraviolet curing zone. The heating zone and the ultraviolet curing zone for the substrate 12, which includes the first laminate film 21, to pass through may be arranged before the vacuum deposition apparatus 24, or the heating device 28 and the UV irradiation apparatus 30 of the organic film deposition apparatus 23 shown in FIG. 2A may be used in the adhesive strength improvement step. In that case, the take-up device 34 takes up the film, while the transfer apparatus applies certain tension (about 50 to 500 N/m). The adhesion between the substrate taken up while applying heat and the first laminate film 21 improves, and removal and deformation during handling in the vacuum deposition are unlikely to occur.

On the other hand, the second laminate film 22 is removed in the vacuum deposition apparatus 24, and it is preferable that the adhesion of the second laminate film 22 is low. Therefore, it is preferable to attach the second laminate film 22 after the adhesion improvement step for the first laminate film 21.

The material of the organic film 14 can be a material that allows an anchor coat layer for improving the adhesion, an oxide film deposited by atmospheric pressure plasma, and a thermosetting or UV-curing organic film to be used before the deposition of the inorganic film.

Specifically, for example, it is preferable that two or more ethylenic unsaturated double bonds are included as monomers or oligomers and that the monomers and the oligomers are added and polymerized by irradiation of light.

For example, a UV-curing resin can be applied as the organic film 14 to improve the strength and the surface smoothness. An example of the ultraviolet-curing resin includes a mixed solution of a compound of polymerizable monomer BEPGA 15 g of Kyoeisha Chemical Co., Ltd. and polymerizable monomer V-3PA 5 g of Osaka Organic Chemical Industry, Ltd., an ultraviolet polymerization initiator (produced by Lamberti, product name: Esacure KTO-46) 1.5 g, and 2-butanone 190 g, and the solution can be applied to the substrate to form the organic film.

In place of BEPGA and V-3PA, acrylic monomers: KAYARAD DPHA (produced by Nippon Kayaku Co., Ltd.) and KAYARAD TMPTA (produced by Nippon Kayaku Co., Lid.) can be used.

For example, the adhesion can be improved by applying a thermosetting resin for the organic film 14. For example, a thermosetting resin (epoxy resin EPICLON 840-S of DIC Corporation (bisphenol A liquid)) can be diluted by methyl ethyl ketone to adjust the solid content concentration to 5% and can be applied to the substrate to form the organic film 14. Alternatively, a polyester resin (Vylon 200 of Toyobo Co., Ltd.) can be used.

Examples of the deposition method of the organic film include a normal solution application method and a vacuum deposition method. Examples of the solution application method include a dip coating method, an air knife coating method, a curtain coating method, a roller coating method, a wire bar coating method, a gravure coating method, a slide coating method, and an extrusion coating method using a hopper described in U.S. Pat. No. 2,681,294.

When a gas barrier film (vapor barrier film) is manufactured as the functional film 10, it is preferable to deposit a silicon nitride film, an aluminum oxide film, a silicon oxide film, etc. as the inorganic film.

It is preferable to deposit a silicon oxide film, etc., as the inorganic film when a protective film of various devices and apparatuses, such as an organic EL display, a liquid crystal display, and other display devices, is manufactured as the functional film 10.

Furthermore, it is preferable to deposit a film made of a material having or expressing target optical characteristics as the inorganic film to manufacture a functional film, such as an anti-reflective film, a light reflection film, and various other filters.

Although the manufacturing method of functional film of the present invention has been described in detail, the present invention is not limited to the embodiment, and various modifications and changes can be made without departing from the scope of the present invention.

Second Embodiment

Figure 4:
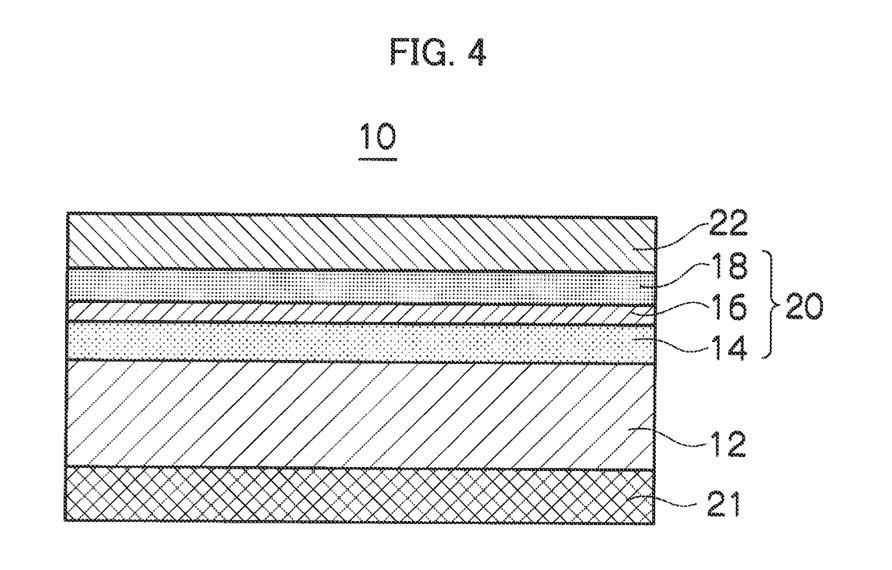
FIG. 4 is a configuration diagram of another functional film.

FIG. 4 shows an example of a configuration diagram of the functional film of another embodiment. The functional film 10 includes the substrate 12, the organic film 14 arranged on one side of the substrate 12, the inorganic film 16 arranged on the organic film 14, and the organic film 18 arranged on the inorganic film 16. The organic film 14, the inorganic film 16, and the organic film 18 function as the functional layer 20. The organic film 18 as the top layer also functions as a protection layer. The first laminate film 21 is arranged on the other side of the substrate 12. The second laminate film 22 is arranged on the organic film 18 as the top layer of the functional layer 20.

Figure 5:
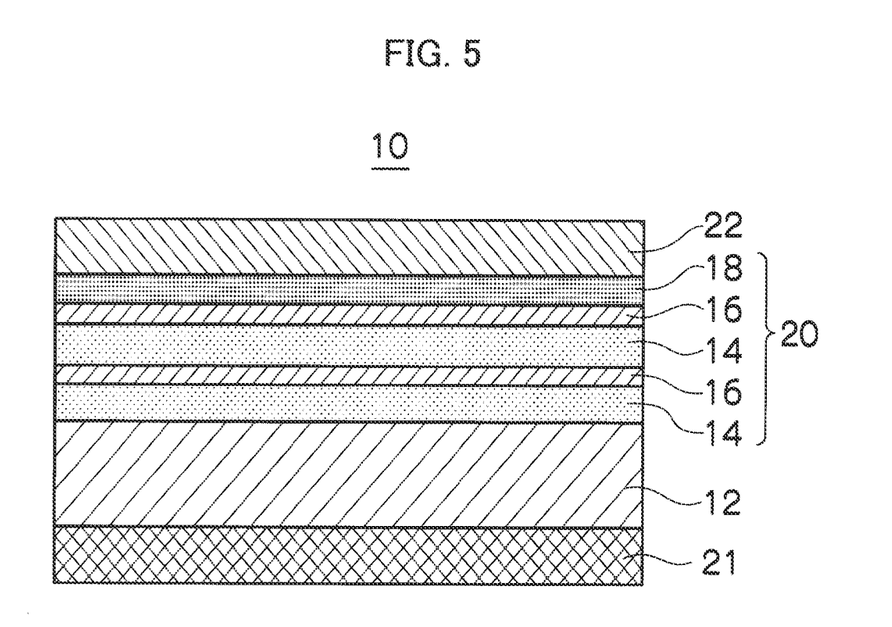
FIG. 5 is a configuration diagram of another functional film.

FIG. 5 shows an example of a configuration diagram of the functional film of another embodiment. The functional film 10 includes the substrate 12, the organic film 14 arranged on one side of the substrate 12, and the inorganic film 16 arranged on the organic film 14. The organic film 14 and the inorganic film 16 are further arranged on the inorganic film 16 in this order. The organic film 18 arranged on the inorganic film 16 is also included. The organic film 14, the inorganic film 16, the organic film 14, the inorganic film 16, and the organic film 18 function as the functional layer 20. The organic film 18 as the top layer also functions as a protection layer. The first laminate film 21 is arranged on the other side of the substrate 12. The second laminate film 22 is arranged on the organic film 18 as the top layer of the functional layer 20.

Since the first laminate film 21 is arranged on the other side of the substrate 12 in the functional film, the self-support is provided to the substrate 12. The self-support denotes elasticity (rigidity) of film.

Since the substrate 12 is self-supported, vertical wrinkles, folds, etc., are not generated during the deposition/transfer process using roll-to-roll. This can prevent the organic films and/or inorganic films deposited on the substrate 12 from being destroyed.

The first laminate film 21 preferably has a center line average roughness (Ra) of 5 to 80 nm. During the deposition/transfer process using roll-to-roll, the substrate 12 is taken up in a roll shape after the deposition of the inorganic film 16. At this point, the first laminate film 21 and the inorganic film 16 touch each other. Since the first laminate film 21 has the center line average roughness (Ra) of 5 to 80 nm, the contact area between the first laminate film 21 and the inorganic film 16 can be reduced. As a result, the frictional resistance between the first laminate film 21 and the inorganic film 16 can be reduced, and the slipping property can be improved. If the center line average roughness (Ra) of the first laminate film 21 is greater than the thickness of the inorganic film 16, the inorganic film 16 may be perforated and destroyed. Therefore, the preferable center line average roughness (Ra) of the first laminate film 21 is 5 to 80 nm, which is less than the thickness of the inorganic film.

A film made of polyethylene (PE), polyethylene terephthalate (PET), polyethylene naphthalate (PEN), etc., can be used as the first laminate film 21.

The second laminate film 22 is arranged at the top layer of the functional layer 20 in the functional film. Therefore, the second laminate film 22 protects the top layer of the functional layer 20 during the storage/transport process. When the functional layer 20 is formed on the substrate 12, the functional film 10 is completed. The second laminate film 22 is then attached on the top layer of the functional layer 20, and the functional film 10 is stored in a form of a roll or a sheet and transported to another location. The second laminate film 22 prevents scratches, etc., of the functional layer 20 during the transport, and the functional layer 20 can attain a desired function.

The top layer of the functional layer 20 may be damaged if the center line average roughness (Ra) of the second laminate film 22 is large. Therefore, the preferable center line average roughness (Ra) of the second laminate film 22 is 5 to 50 nm.

The adhesion between the second laminate film 22 and the top layer of the functional layer 20 is less than the adhesion between the first laminate film 21 and the substrate 12. The independent use of the functional film 10 is rare. The second laminate film 22 is removed from the functional layer 20 of the functional film 10. In the assembly process, the functional layer 20 is attached to another product, such as a substrate provided with an organic EL element. In this case, the second laminate film 22 can be easily removed because the adhesion of the second laminate film 22 is weaker than the adhesion of the first laminate film 21. Since the adhesion of the second laminate film 22 is not large, the removal of the second laminate film 22 does not damage the functional layer 20.

Preferably, the Young's modulus of the second laminate film 22 is less than the Young's modulus of the first laminate film 21. The first laminate film is not wrinkled due to the tension of the second laminate film being removed when the second laminate film is peeled off first.

In the step of peeling off the second laminate film, the substrate and the first laminate film provided to the substrate are held (fixed) by something. If the Young's modulus of the first laminate film stretched to obtain the self-support of the substrate is greater than the Young's modulus of the second laminate film, the first laminate film with low Young's modulus may be pulled (tension of being peeled off) and bent. Since the Young's modulus of the second laminate film is low, the destruction of the first laminate film can be prevented.

A film made of polyethylene (PE), polyethylene terephthalate (PET), polyethylene naphthalate (PEN), etc., can be used as the second laminate film 22.

The center line average roughness (Ra) is defined by measuring the roughness of the surface of the laminate and averaging the peaks of projections and depressions of the roughness. The surface roughness of the first laminate film 21 and the second laminate film 22 are based on the center line average roughness (Ra) obtained by using an atomic force microscope (AFM) and measuring the roughness in a range of 10 μm.

The substrate 12 is not particularly limited if the deposition of the organic films 14 and the inorganic films 16 by vacuum deposition is possible. Various substrates used in functional films, such as PET films and various other resin films as well as aluminum sheets and various other metals, can be used.

Examples of the organic films 14 include all films, such as an anchor coat layer for improving the adhesion, an oxide film deposited by atmospheric pressure plasma, and a thermosetting or UV-curing organic film, that are deposited before the deposition of the inorganic films.

It is preferable that the inorganic films 16 include at least one of or a composite of metal, metal oxide, metal nitride, metal carbide, and metal fluoride.

A manufacturing method of functional film (deposition/transfer process) will be described. The manufacturing apparatus that manufactures the functional film includes, for example, the organic film deposition apparatus 23 that deposits an organic film on the front side of the substrate 12 and the vacuum deposition apparatus 24 that deposits an inorganic film on the organic film.

Figure 6A:
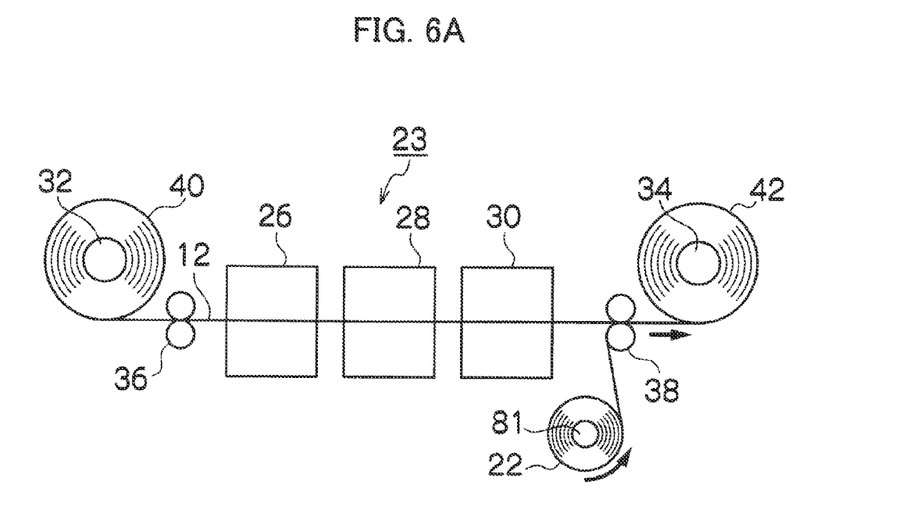
FIGS. 6A and 6B are diagrams showing an example of an apparatus which performs a manufacturing method of functional film.

FIG. 6A conceptually shows an example of the organic film deposition apparatus 23. The organic film deposition apparatus 23 includes the coating device 26, the heating device 28, and the UV irradiation apparatus 30. The organic film deposition apparatus 23 deposits the organic film by roll-to-roll. The film roll 40 is first loaded on the feeding device 32. The take-up roller 36 then transfers the substrate 12 in a longitudinal direction from the film roll 40. The coating device 26 applies, for example, a coating solution containing prepared radiation-curing monomer or oligomer to the substrate 12. The heating device 28 dries the coating solution and evaporates the solvent. The UV irradiation apparatus 30 applies an ultraviolet ray to the coating solution after drying to start polymerization reaction. The organic film 14 is hardened and deposited on the substrate 12.

In the present embodiment, the first laminate film 21 is included on the back side, and the self-supported substrate 12 is taken up into a roll shape and prepared as the film roll 40. Once the first laminate film 21 is attached to the back side of the substrate, the first laminate film 21 is not removed from the substrate 12 until a functional layer including required number of organic films 14 and inorganic films 16 is laminated on the substrate.

Figure 6B:
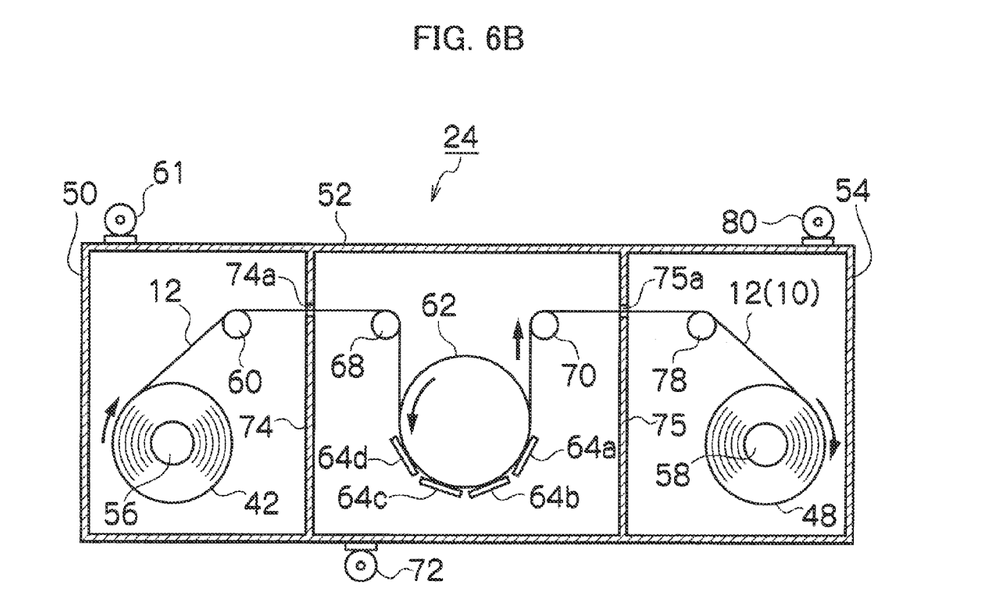

Like the organic film deposition apparatus 23, the vacuum deposition apparatus 24 is an apparatus that forms an inorganic film by roll-to-roll as shown in FIG. 6B. The vacuum deposition apparatus 24 includes the feed chamber 50, the deposition chamber 52, and the take-up chamber 54. The feeding device 56 of the feed chamber 50 feeds the substrate 12 from the film roll 42. The inorganic film is deposited on the organic film of the substrate 12 in the deposition chamber 52 while the substrate 12 is transferred in the longitudinal direction. The take-up device 58 of the take-up chamber 54 takes up the substrate 12, on which a laminated body (the functional layer 20) including the organic film 14 and the inorganic film 16 is deposited, into the film roll 48.

A deposition method of the inorganic film will be described. The feed chamber 50 of the vacuum deposition apparatus 24 includes the feeding device 56, the guide roller 60, and the evacuation device 61.

The feeding device 56 feeds the substrate 12 from the film roll 42. The guide roller 60 guides the substrate 12 including the exposed organic film 14 to pass through a predetermined path and through the slit 74a of the partition 74, and the substrate 12 is transferred to the deposition chamber 52. A driving source not shown rotates the feeding device 56 clockwise in FIG. 6B in the feed chamber 50. Since the first laminate film 21 is attached to the back side of the substrate 12, the substrate 12 is self-supported.

The inorganic film 16 is deposited on the front side of the substrate 12, i.e. on the surface of the organic film 14, in the deposition chamber 52. As shown in FIG. 6B, the deposition chamber 52 includes the drum 62, the deposition devices 64a, 64b, 64c, and 64d, the guide rollers 68 and 70, and the evacuation device 72. If the deposition chamber 52 is designed to form a film by sputtering, plasma CVD, etc., a high-frequency power source, etc. is further installed in the deposition chamber 52.

A driving source not shown rotates the drum 62 of the deposition chamber 52 counterclockwise in FIG. 6B around the center line. The substrate 12 guided to a predetermined path by the guide roller 68 is wound around a predetermined area in the peripheral surface of the drum 62, and the drum 62 supports and guides the substrate 12 to transfer the substrate 12 through a predetermined transfer path. The deposition devices 64a to 64d deposit an inorganic film 16 on the organic film 14. It is preferable that the thickness of the inorganic film deposited at this time is 5 nm to 200 nm.

The deposition devices 64a to 64d are devices that deposit an inorganic film on the front side of the substrate 12 by a vacuum deposition method. The deposition device is not limited, and all known vacuum deposition methods (vapor deposition methods), such as CVD, plasma CVD, sputtering, vacuum deposition, and ion plating, can be used.

After the deposition of the inorganic film 16 by the deposition devices 64a to 64d, the guide rollers 70 and 78 guide the substrate 12 to the slit 75a of the partition 75, and the substrate 12 is transferred to the take-up chamber 54. The evacuation device 80 is arranged in the take-up chamber 54. The evacuation device 80 reduces the pressure to set a predetermined pressure in the take-up chamber 54. The take-up device 58 arranged in the take-up chamber 54 takes up the substrate 12 into the film roll 48.

In addition to the illustrated members, transfer devices that transfer the substrate 12 in a predetermined path may be arranged in the feed chamber 50, such as a pair of transfer rollers and a guide member that restricts the position of the substrate 12 in the width direction.

Providing the first laminate film 21 to the back side of the substrate 12 allows the substrate 12, on which the inorganic film 16 is deposited, to have appropriate rigidity. The substrate 12 can be transferred without the generation of vertical wrinkles and folds when the vacuum deposition apparatus 24 is transferred (or moved back and forth for a plurality of times).

As shown in FIG. 6B, the substrate 12 including the deposited inorganic film 16 is taken up into the film roll 48 in the take-up chamber 54. Since the first laminate film 21 has the center line average roughness (Ra) of 5 to 80 nm, the contact area between the first laminate film 21 and the inorganic film can be reduced. As a result, the frictional resistance between the first laminate film 21 and the inorganic film can be reduced, and the slipping property can be improved.

The film roll 48 is set as the film roll 40 on the feeding device 32 of the organic film deposition apparatus 23, and the organic film is deposited on the inorganic film. The deposition/transfer process for forming the functional layer basically ends. The laminate film feeding device 81 feeds the second laminate film 22. The pair of nip rollers 38 attach the second laminate film 22 to the surface of the organic film. The functional film 10 including the substrate 12, the functional layer 20 including the organic film 14, the inorganic film 16, and the organic film 18 arranged on one side of the substrate 12, the first laminate film 21 arranged on the other side of the substrate 12, and the second laminate film 22 arranged on the top layer of the functional layer 20 is completed.

Passing through the vacuum deposition apparatus 24 and the organic film deposition apparatus 23 without the attachment of the second laminate film 22 is possible. As a result, the functional layer 20 including the organic film 14, the inorganic film 16, the organic film 14, the inorganic film 16, and the organic film 18 can be formed.

As shown in FIG. 6A, the laminate film feeding device 81 feeds the second laminate film 22, and the pair of nip rollers 38 attach the second laminate film 22 on the surface of the organic film. The functional film 10 including the substrate 12, the functional layer 20 including the organic film 14, the inorganic film 16, the organic film 14, the inorganic film 16, and the organic film 18 arranged on one side of the substrate 12, the first laminate film 21 arranged on the other side of the substrate 12, and the second laminate film 22 arranged on the top layer of the functional layer 20 is completed.

The process moves to the storage/transport process when the functional film 10 is taken up in a film shape after the attachment of the second laminate film 22. The first laminate film 21 and the second laminate film 22 protect the substrate 12 and the functional layer 20.

The functional film 10 is roll-shaped or sheet-shaped in the storage/transport process. The shape of the roll denotes an object obtained by taking up the functional film 10 into the film roll. The shape of the sheet denotes an object after uncoiling of the film roll and includes objects cut into a predetermined size.

Figure 7:
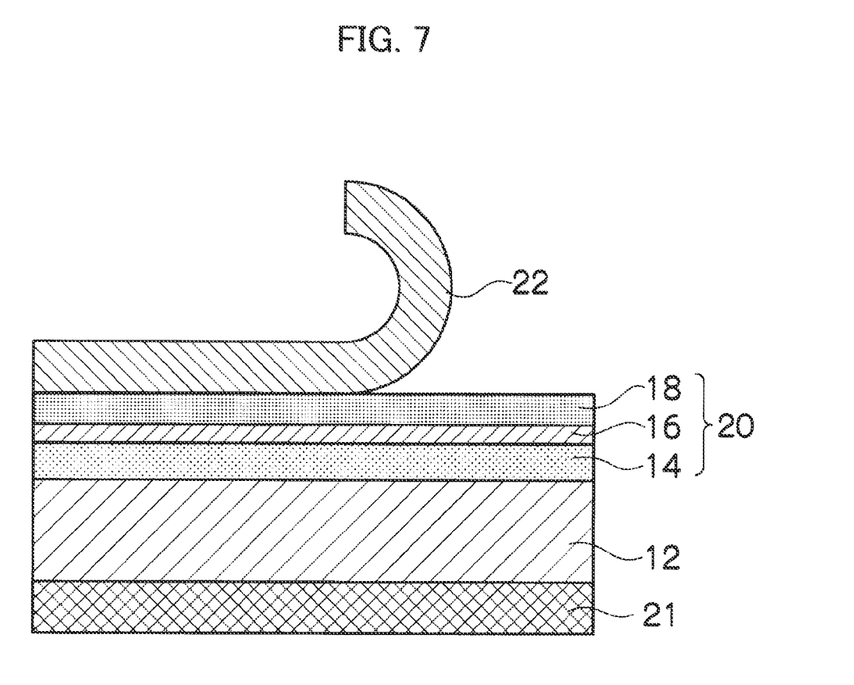
FIG. 7 is a diagram showing state of peeling a second laminate film.

The roll-shaped or sheet-shaped functional film 10 is transported to the assembly process. As shown in FIG. 7, the second laminate film 22 is removed to attach the functional film 10 to another product. Since the adhesion of the second laminate film 22 is weaker than the adhesion of the first laminate film 21, the second laminate film 22 can be easily removed. Since the adhesion of the second laminate film 22 is not large, the removal of the second laminate film 22 does not damage the functional layer 20. In view of the assembly process, what is important is that the adhesion of the second laminate film 22 is weaker than the adhesion of the first laminate film 21. The first laminate film 21 is further removed as necessary after the attachment of the other product and the functional layer 20.

The same material as in the first embodiment can be used as a material of the organic film 14, and the same manufacturing method can be used.

Example 1

Specific examples of the present invention will be listed to describe the present invention in more detail. However, the examples are not limited to these.

PET bases with 1000 mm width and different thicknesses are used as the substrate. The first laminate film 21 with several thicknesses is prepared to provide the self-support. The first laminate film is laminated on the back side of the PET base to prepare the substrate. Acrylate monomer and a photopolymerization initiator are dissolved by an organic solvent and applied to the substrate by a die coater. The coating film is dried and further hardened by ultraviolet curing to deposit an organic film on the substrate. A film roll is created while controlling the take-up tension in accordance with the diameter of the roll to make the tension constant. The fluid flow to the substrate is controlled to make the thickness of the organic film 1 µm after complete curing.

After the formation of the organic film, i.e. after curing, a second laminate film is laminated on the surface of the organic film. Specifically, after the UV irradiation apparatus, the substrate and the second laminate film are placed between a pair of nip rolls to attach the second laminate film to the surface of the organic film. In this case, heat is not applied, and the second laminate film is attached to the surface of the organic film only by the force of the adhesion layer in the second laminate film.

A spiral roll is arranged between the pair of nip rolls. The second laminate film is uniformly attached to the surface of the organic film while the second laminate film is extended in the width direction by the spiral roll. This is because if the second laminate film is not uniformly attached, the air between the second laminate film and the organic layer does not uniformly come out when the substrate is exposed in the vacuum. The substrate is deformed by remaining air, and the substrate is damaged by wrinkles, etc.

A plurality of types of second laminate films with different adhesions are prepared and attached. To remove the air between the second laminate films and the organic layers as much as possible, the film roll including the rolled substrate, on which the organic films formed under various conditions are deposited, is left in the atmosphere for more than one hour. Leaving the film roll in the atmosphere can release the air between the second laminate films and the organic films by the weight of the film roll. The film roll is then set to a vacuum deposition apparatus. After evacuation of the vacuum deposition apparatus, the second laminate film is removed in a feed chamber or immediately before a deposition drum, and an inorganic film is deposited on the surface of the organic film. In the removal of the second laminate film, the torque is controlled in consideration of the improvement of the adhesion in the vacuum, and the second laminate film is removed from the substrate. Specifically, the torque is controlled to control the motion of the film roll by the removal/take-up section.

Aluminum is the target of the inorganic film, and an alumina film is formed by reactive sputtering to obtain a functional film. Water vapor permeability is used to evaluate the performance of the functional film manufactured this way. The water vapor permeability is defined by the criteria of Table 1.

TABLE 1

| Performance (Moisture Permeability) | Evaluation Criteria |
|---|---|
| $1.0 \times 10^{-3}$ g/m² · day or more | D |
| $2.0 \times 10^{-4}$ g/m² · day or more and less than $1.0 \times 10^{-3}$ g/m² · day | C |
| $1.0 \times 10^{-4}$ g/m² · day or more and less than $2.0 \times 10^{-4}$ g/m² · day | B |
| Less than $1.0 \times 10^{-4}$ g/m² · day | A |

Figure 8:
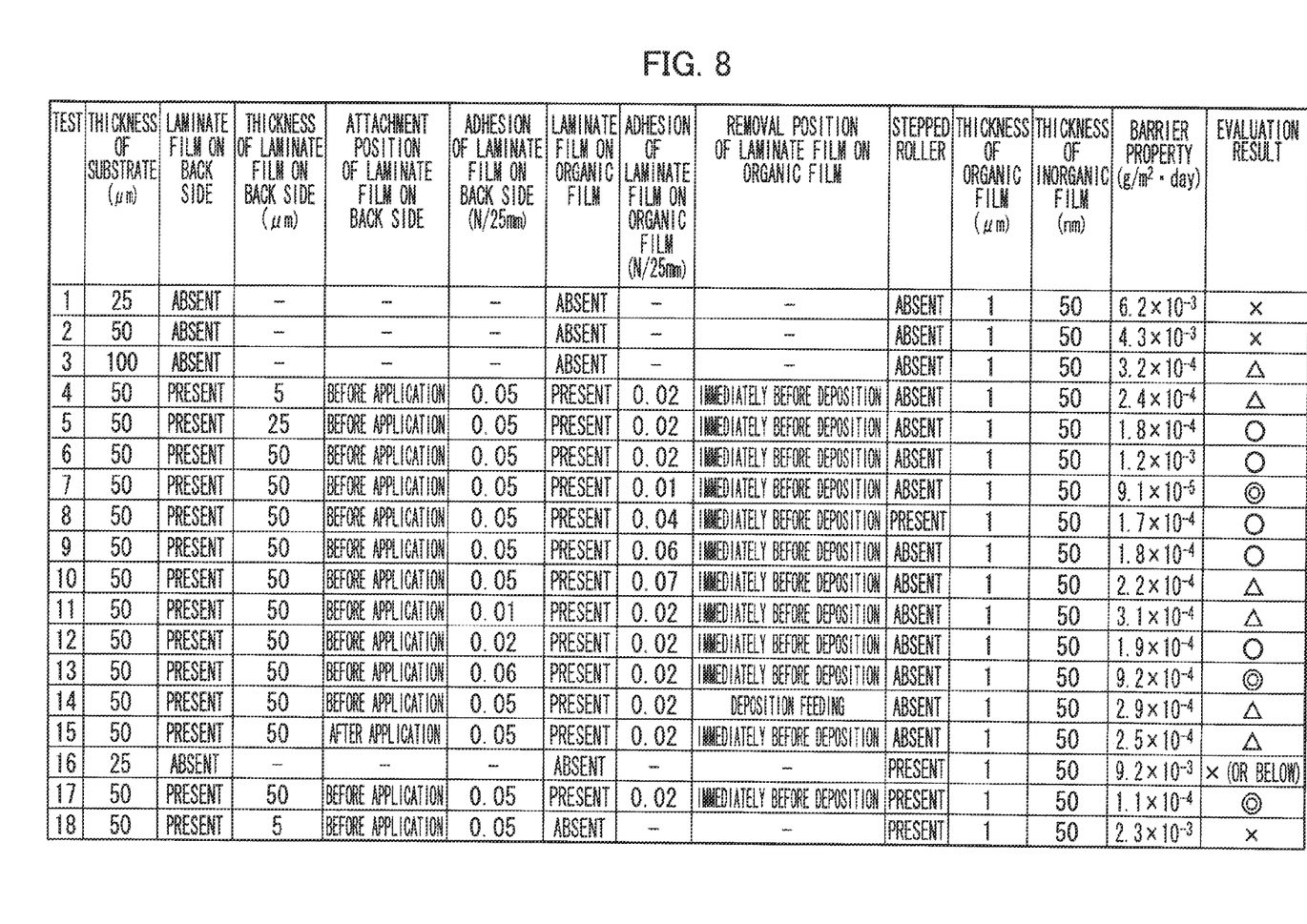
FIG. 8 is a table showing results of Examples.

A table of FIG. 8 shows a compilation of manufacturing conditions and evaluation results of Tests 1 to 18.

[Test 1]

The thickness of the substrate is 25 μm, and the first laminate film and the second laminate film are not attached to either side of the substrate. A non-stepped guide roller is used to transfer the substrate in the vacuum deposition apparatus. An inorganic film of 50 nm is deposited on the organic film.

[Test 2]

The condition is the same as in Test 1, except that the thickness of the substrate is 50 μm.

[Test 3]

The condition is the same as in Test 1, except that the thickness of the substrate is 100 μm.

[Test 4]

The first laminate film with 5 μm thickness is laminated on the back side of the substrate with 50 μm thickness before the application of the organic material, and the film roll is formed. The thickness of the first laminate film includes the thickness of the adhesion layer. The film roll is set in the organic film deposition apparatus. After irradiation of ultraviolet to the organic material on the substrate and curing of the organic material (i.e. after deposition of the organic film), the second laminate film is laminated on the surface of the organic film, and the film is taken up into a film roll. The adhesion of the first laminate film on the back side is 0.005 (N/25 mm), and the adhesion of the second laminate film on the organic film is 0.002 (N/25 mm). The film roll is set in the vacuum deposition apparatus. The second laminate film on the organic surface is removed immediately before the deposition of the inorganic film, and an inorganic film of 50 nm is deposited on the exposed organic film. A non-stepped guide roller is used to transfer the substrate. "Immediately before Deposition" denotes a position immediately before the drum arranged in the deposition chamber of the vacuum deposition apparatus.

[Test 5]

The condition is the same as in Test 4, except that the thickness of the first laminate film on the back side is 25 μm.

[Test 6]

The condition is the same as in Test 4, except that the thickness of the first laminate film on the back side is 50 μm.

[Test 7]

The condition is the same as in Test 6, except that the adhesion of the second laminate film on the organic film is 0.01 (N/25 mm)

[Test 8]

The condition is the same as in Test 6, except that the adhesion of the second laminate film on the organic film is 0.04 (N/25 mm)

[Test 9]

The condition is the same as in Test 6, except that the adhesion of the second laminate film on the organic film is 0.06 (N/25 mm)

[Test 10]

The condition is the same as in Test 6, except that the adhesion of the second laminate film on the organic film is 0.07 (N/25 mm)

[Test 11]

The condition is the same as in Test 6, except that the adhesion of the first laminate on the back side is 0.01 (N/25 mm)

[Test 12]

The condition is the same as in Test 6, except that the adhesion of the first laminate film on the back side is 0.02 (N/25 mm)

[Test 13]

The condition is the same as in Test 6, except that the adhesion of the first laminate film on the back side is 0.06 (N/25 mm)

[Test 14]

The condition is the same as in Test 6, except that the removal position of the second laminate film on the organic film is "Deposition Feeding". "Deposition Feeding" denotes a position immediately after feeding from the feeding device arranged in the feed chamber of the vacuum deposition apparatus.

[Test 15]

The condition is the same as in Test 6, except that the attachment position of the first laminate film on the back side is after the application. "After Application" denotes a position after passing of the UV irradiation apparatus of the organic film deposition apparatus.

[Test 16]

The condition is the same as in Test 1, except that the substrate is transferred by a stepped guide roller.

[Test 17]

The condition is the same as in Test 6, except that the substrate is transferred by the stepped guide roller.

[Test 18]

The condition is the same as in Test 6, except that the second laminate film is not laminated on the organic film.

<Evaluation>

In Tests 1 to 3, the first laminate film and the second laminate film are not laminated on the substrate. As a result, the thickness of the substrate is 50 μm or less in Tests 1 and 2, and the evaluation of the barrier property is D since the laminate film is not attached to either side. A possible reason is that the barrier film is broken due to wrinkles in the transfer. The thickness of the substrate is 100 μm in Test 3, and the evaluation of the barrier property is C. The thickness of the substrate is thick in Test 3, and the transfer of the substrate is more stable than the transfer of the substrate with thinner thickness. However, the coating surface is not protected, and there is a problem that minute scratches are generated.

In Tests 4 to 6, the first laminate film and the second laminate film are laminated on the substrate. As a result, the evaluation is C or better. It can be understood from Tests 4 to 6 that the thicker the first laminate film on the back side is, the better is the evaluation result. Better results are obtained when the total thickness of the substrate and the first laminate film on the back side is 75 μm or more.

Better results are obtained from Tests 6 to 10 when the adhesion of the second laminate film on the organic film is lower. A possible reason is that the organic film is not broken when the second laminate film on the organic film is removed. Since there is no air in the vacuum as compared to the state of the atmosphere, the adhesion between the second laminate film and the coated film (organic film) increases. Therefore, a laminate film with low adhesion is suitable for the removal in the vacuum.

Better results are obtained in Tests 6, 11, and 12 when the adhesion of the first laminate film on the back side is higher. A possible reason is that the laminate film on the back side is not peeled off during the transfer of the substrate, and the self-support of the substrate can be maintained.

A better result is obtained in Tests 6 and 14 when the removal position of the second laminate film on the organic film is immediately before the deposition, i.e. after passing of the entire pass roller that touches the organic film. This is because the second laminate film on the organic film prevents direct contact between the organic film and the pass rollers to prevent destruction of the organic film.

A better result is obtained from Tests 6 and 15 when the first laminate film is on the back side of the substrate before the application. If the first laminate film is not on the back side during the application, the self-support of the substrate becomes low, and a transfer error easily occurs.

In Tests 1, 2, 6, and 16 to 18, B or better results are obtained for the barrier property when the first laminate film and the second laminate film are laminated on the surfaces of the substrate even if the stepped guide roller is used. According to Test 16, it can be understood that if the substrate is thin, the barrier property is degraded by vertical wrinkles, etc., even if the stepped guide roller is used to make the functional area noncontact. More specifically, it is important to provide the self-support to the substrate to improve the barrier property even if the stepped guide roller is used to make the functional area noncontact. According to Test 18, it can be understood that even if the self-support is provided to the substrate by the first laminate film on the back side, damage during the take-up cannot be prevented if there is no second laminate film on the organic film, and the performance is degraded.

It can be understood that the attachment of the laminate films (the first laminate film and the second laminate film) to the surfaces of the substrate is important.

Example 2

Specific examples of the present invention will be listed to describe the present invention in more detail. However, the examples are not limited to these.

A PET base with 1000 mm width and 100 μm thickness is used for the substrate. A plurality of types of first laminate films with different adhesion and Young's modulus are prepared. Acrylate monomer and a photopolymerization initiator are dissolved by an organic solvent and applied to the substrate by a die coater. The coating film is dried and further hardened by ultraviolet curing to deposit an organic film on the substrate. A film roll is created while controlling the take-up tension in accordance with the diameter of the roll to make the tension constant. The fluid flow to the substrate is controlled to set the thickness of the organic film to 1 μm after complete curing. The film roll including the organic film formed under various conditions is set to a feeding unit of a vacuum deposition apparatus. After the evacuation of the vacuum deposition apparatus, reactive sputtering is used to deposit an alumina film with 80 nm thickness, and the film is taken up into a film roll.

Water vapor permeability is used to evaluate the performance of the created functional film. The degree of wrinkles on the roll formed by the take-up after the deposition of the inorganic film is checked by visual evaluation. Subsequently, the organic film as a protection layer is formed on the inorganic film after steps of film coating, drying, and ultraviolet curing. The second laminate films with different adhesions are prepared. The second laminate film is placed between nip rolls on the side of the organic surface, and the second laminate film is attached to the organic film as the top layer of the functional layer by the self-adhesion and by the force of the contact pressure between the substrate and the rolls.

A functional film including the first laminate film and the second laminate film is fed by roll-to-roll. A moisture permeability measurement is applied while removing the second laminate film, and the value is measured. The first laminate film on the back side is then removed.

The water vapor permeability is used to evaluate the performance of the manufactured functional film. The water vapor permeability is defined by the criteria of Table 1.

<Evaluation>

Figure 9:
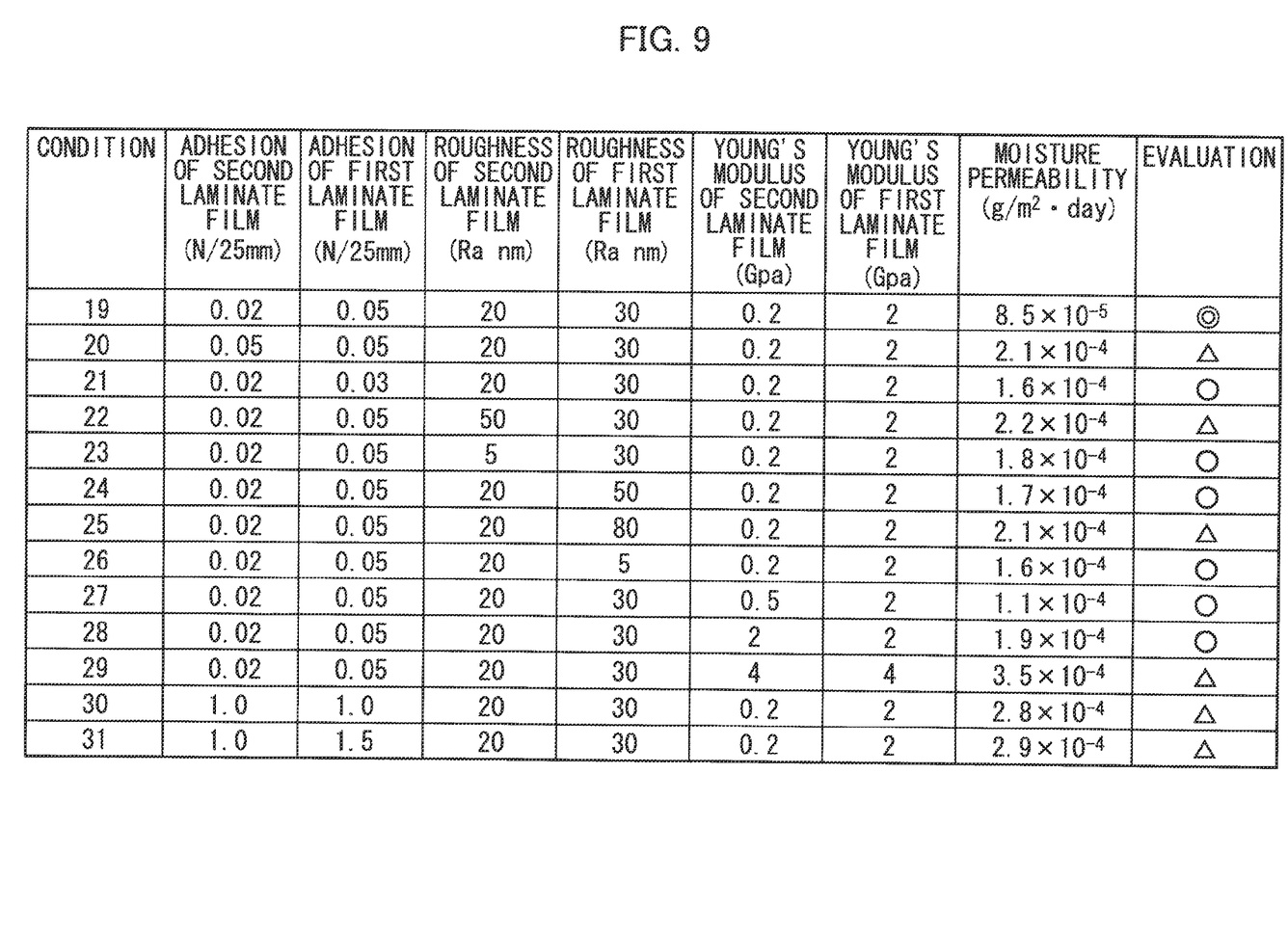
FIG. 9 is a table showing results of Examples.

A table of FIG. 9 shows a compilation of conditions and evaluation results of the first laminate film and the second laminate film in relation to Conditions 19 to 31. The adhesion of the second laminate film is less than the adhesion of the first laminate film under Conditions 19 to 21, and C or better results are obtained. The roughness (Ra) of the second laminate film is in a range of 5 to 50 nm under Conditions 22 and 23, and C or better results are obtained. The roughness (Ra) of the first laminate film is in a range of 5 to 80 nm under Conditions 24 to 26, and C or better results are obtained. It can be understood that better results can be obtained by setting the thickness equal to less than the thickness of the inorganic film.

When the second laminate film is peeled off first under Conditions 27 to 29, wrinkles are not generated due to an influence of the tension of the second laminate film being removed. Force can be uniformly applied to peel off the second laminate film, and C or better results are obtained.

The adhesion of the second laminate film is set to 1.0 (N/25 mm) under Condition 30, and there is a limit that the barrier film (functional layer) is peeled off. Therefore, degradation is observed in the barrier property, and the evaluation is C.

The adhesion of the first laminate film is set to 1.5 (N/25 mm) under Condition 31. The first laminate film is not peeled off from the substrate, and the substrate as a whole has started to fold when the film is peeled off. Therefore, degradation is observed in the barrier property, and the evaluation is C.

What is claimed is:

1. A functional film comprising:
   a substrate;
   a functional layer including at least one organic film and at least one inorganic film that are alternately arranged on one side of the substrate;
   a first laminate film arranged on the other side of the substrate; and
   a second laminate film arranged on a top layer of the functional layer, wherein
   adhesion between the second laminate film and the top layer is less than adhesion between the first laminate film and the substrate.

2. The functional film according to claim 1, wherein Young's modulus of the second laminate film is less than Young's modulus of the first laminate film.

3. The functional film according to claim 1, wherein the adhesion between the second laminate film and the top layer is in a range of 0.02 to 1.0 (N/25 mm), and the adhesion between the first laminate film and the substrate is in a range of 0.03 to 1.5 (N/25 mm).

4. The functional film according to claim 1, wherein center line average roughness (Ra) of the second laminate film is 5 to 50 nm, and center line average roughness (Ra) of the first laminate film is 5 to 80 nm.

5. The functional film according to claim 1, wherein thickness of the inorganic film is 200 nm or less.

6. The functional film according to claim 1, wherein the inorganic film contains a material selected from the group consisting of metal, metal oxide, metal nitride, metal carbide, metal fluoride, and composites of the metal, metal oxide, metal nitride, metal carbide, and metal fluoride.

7. The functional film according to claim 1, wherein the organic film contains one of radiation-curing monomer and oligomer.

* * * * *